United States Patent
Lunger et al.

(10) Patent No.: US 9,658,257 B1
(45) Date of Patent: May 23, 2017

(54) WIRELESS COMMUNICATION ENERGIZER AND MONITORING UNIT FOR ELECTRIC FENCING AND METHOD THEREFOR

(71) Applicant: Woodstream Corporation, Lititz, PA (US)

(72) Inventors: Aaron William Lunger, Lancaster, PA (US); Thomas J. Daly, Jr., Lititz, PA (US)

(73) Assignee: WOODSTREAM CORPORATION, Lititz, PA (US)

( * ) Notice: Subject to any disclaimer, the term of this patent is extended or adjusted under 35 U.S.C. 154(b) by 0 days.

(21) Appl. No.: 15/234,260

(22) Filed: Aug. 11, 2016

(51) Int. Cl.
*G01R 19/165* (2006.01)
*G08B 25/10* (2006.01)

(52) U.S. Cl.
CPC ....... *G01R 19/16533* (2013.01); *G08B 25/10* (2013.01)

(58) Field of Classification Search
CPC .. A01K 3/005; G08B 13/122; G08B 13/1654; G01R 19/16533; G01R 19/16566
See application file for complete search history.

(56) References Cited

U.S. PATENT DOCUMENTS

| 4,518,953 A * | 5/1985 | Hunter | G08B 13/122 256/10 |
| 6,081,198 A * | 6/2000 | Adamson | H05C 3/00 324/527 |

* cited by examiner

*Primary Examiner* — Curtis Odom
(74) *Attorney, Agent, or Firm* — Jacobson Holman, PLLC.

(57) ABSTRACT

An electric fence monitoring unit and an integrated energizer/monitoring unit with remote control and communication capability using GSM based cellular technology, and a method for the use thereof, is provided. A simple set of commands can be used and sent, such as through text messaging (SMS) or a smartphone application, to control and/or receive information from the monitoring unit including alerts sent to the user in the case of faults or changes in fence loading. The monitoring unit includes a safety mode that uses time dependent voltage detection to detect when a sudden and significant drop in fence voltage has occurred, as may result when an animal becomes trapped or entangled in the fence. When such a large and rapid voltage drop is detected and the safety mode is enabled, the unit automatically de-energizes the electric fence and an alert is sent to the user advising that the fence should be looked at without delay.

16 Claims, 3 Drawing Sheets

WIRELESS COMMUNICATION ENERGIZER AND MONITORING UNIT FOR ELECTRIC FENCING AND METHOD THEREFOR

BACKGROUND OF THE INVENTION

Field of the Invention

The present invention is related to the field of electric fencing for animals and, more particularly, to an intelligent fence energizer and monitoring unit system and method with remote notification and control capability using GSM based cellular technology.

Description of the Related Art

Electric fencing is commonly used for livestock and animal containment as well as for deterrence of other types of animals including birds and predators. GSM devices have been developed to monitor and control the fence voltage levels and to provide remote notification to the user of the status of the fence. One example of an electric fence monitoring system that provides communication between the fence and a remote user is described in U.S. Publ. No. 2002/0033756.

Voltage levels on the fence may decline as the result of various forms of interference with the fence that create a partial or even a full load, most typically some form of vegetation growing into the fence wire. Grounding due to vegetation growth will generally cause the voltage to drop gradually, commensurate with the growth rate of the vegetation that is growing into the fence. However, existing electric fencing systems do not have the capability to distinguish between a slow drop in voltage over time and a more precipitous and sudden drop that may indicate that the fence energizer should be shut off immediately, such as when an animal has become entangled in the fence.

Accordingly, a need exists for an electric fence energizer and monitoring unit having a safety mode that will initiate rapid and automatic powering down of the energizer in response to the detection of a rapid and significant drop in voltage.

SUMMARY OF THE INVENTION

In view of the foregoing, the present invention is directed to a system and method for remotely monitoring voltage levels on an electric fence used for animal containment and the like. The system includes a monitoring unit that can be controlled and monitored remotely using GSM based cellular technology and may be embodied as an energizer/monitoring unit system that includes both the remote monitoring unit and an integrated fence energizer or voltage pulse generator for supplying current to the fence. To control and/or receive information from the remote monitoring unit, a simple set of commands can be sent, such as through text messaging (SMS) or a smartphone application, including alerts sent to the user in case of faults or changes in fence loading. The remote monitoring unit includes a safety mode using time dependent voltage detection that, when enabled, causes the remote monitoring unit to automatically turn the fence voltage energizer off and alert the user when a rapid and significant drop in fence voltage is detected.

Accordingly, it is an object of the present invention to provide a remote monitoring unit or a combined energizer/remote monitoring unit for an electric fence system that can be remotely controlled and that has a safety mode that initiates automatic shutdown of the energizer.

Another object of the present invention is to provide a remote monitoring unit or a combined energizer/monitoring unit for an electric fence system in accordance with the preceding object that uses time dependent voltage detection to correlate the speed and extent of a voltage drop in order to recognize when the voltage drop may indicate an animal has become trapped or otherwise entangled in the fence.

A further object of the present invention is to provide a remote monitoring unit or a combined energizer/monitoring unit for an electric fence system in accordance with the preceding objects that is configured to send an alert to the user when a rapid drop in voltage is detected.

Yet another object of the present invention is to provide an energizer/monitoring unit for an electric fence system in accordance with the preceding objects that also sends an alert to the user when the voltage has dropped below a set threshold to notify the user that the fence may require immediate action.

Another object of the present invention is to provide a remote monitoring unit that can be retrofitted into an existing electric fence and energizer system.

Still another object of the present invention is to provide a method of operating a remote monitoring unit or a combined energizer/monitoring unit for an electric fence system that includes configuring the monitoring unit to automatically shut down the energizer upon detecting a rapid and significant drop in voltage.

Yet another object of the present invention is to provide a method in accordance with the preceding object that correlates voltage detection and time in order to recognize a voltage drop having a speed and extent that may indicate an animal has become trapped or otherwise entangled in the fence.

These together with other objects and advantages which will become subsequently apparent reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

In describing the preferred embodiments, specific terminology will be resorted to for the sake of clarity. It is to be understood that each specific term includes all technical equivalents which operate in a similar manner to accomplish a similar purpose.

Figure 1:
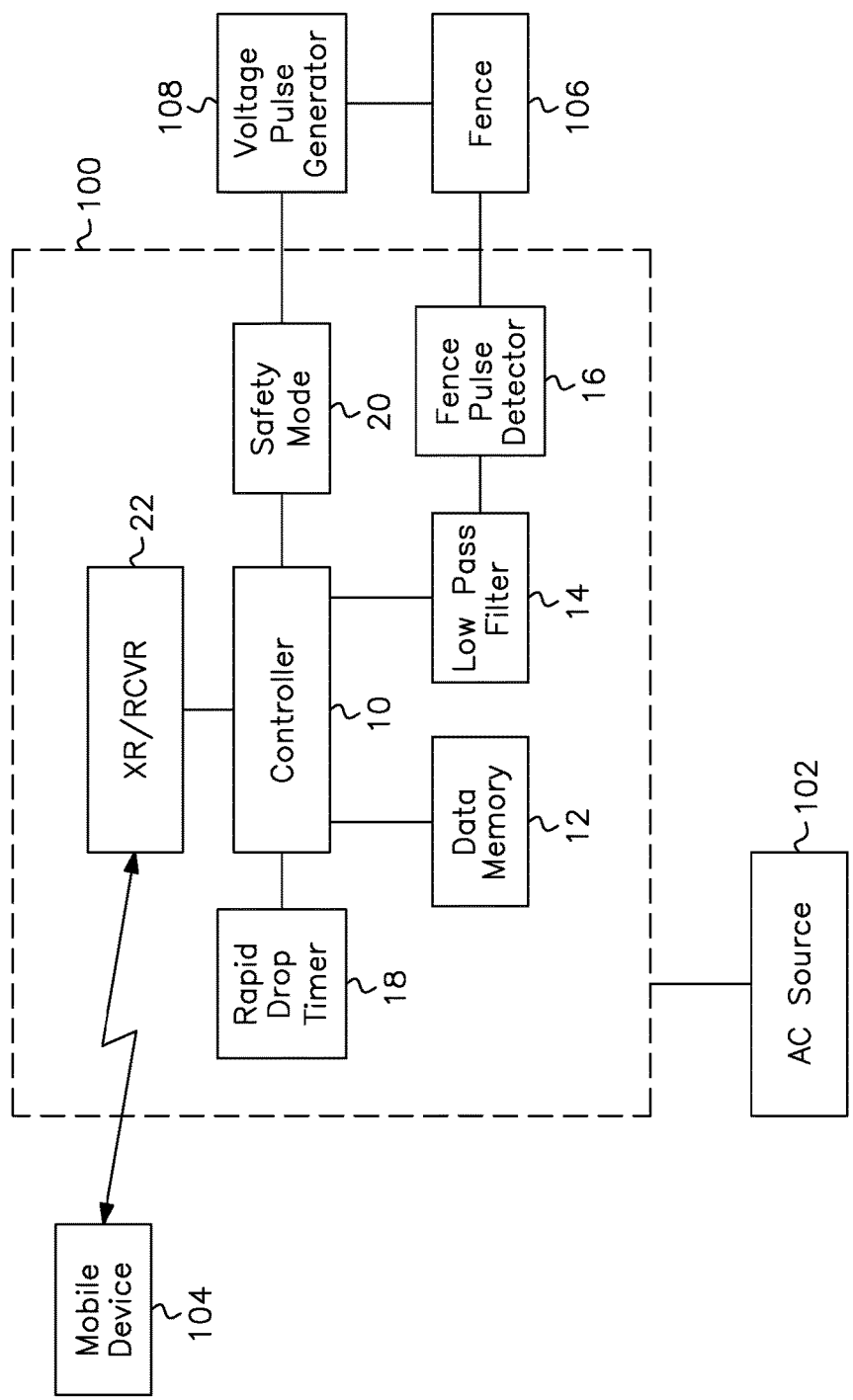
FIG. 1 is a block diagram of an electric fencing system with a remote monitoring unit having a rapid voltage drop detection system in accordance with the present invention.

As shown in FIG. 1, the present invention is directed to a remote monitoring unit with a rapid voltage drop detection system 100, which is connected to a voltage source 102 and configured for wireless communication with a remote mobile device 104. The remote monitoring unit 100 is electrically connected to an electric fence 106, used for animal containment and the like, which is supplied with high voltage pulses from an energizer, here embodied as a voltage pulse generator 108.

Figure 2:
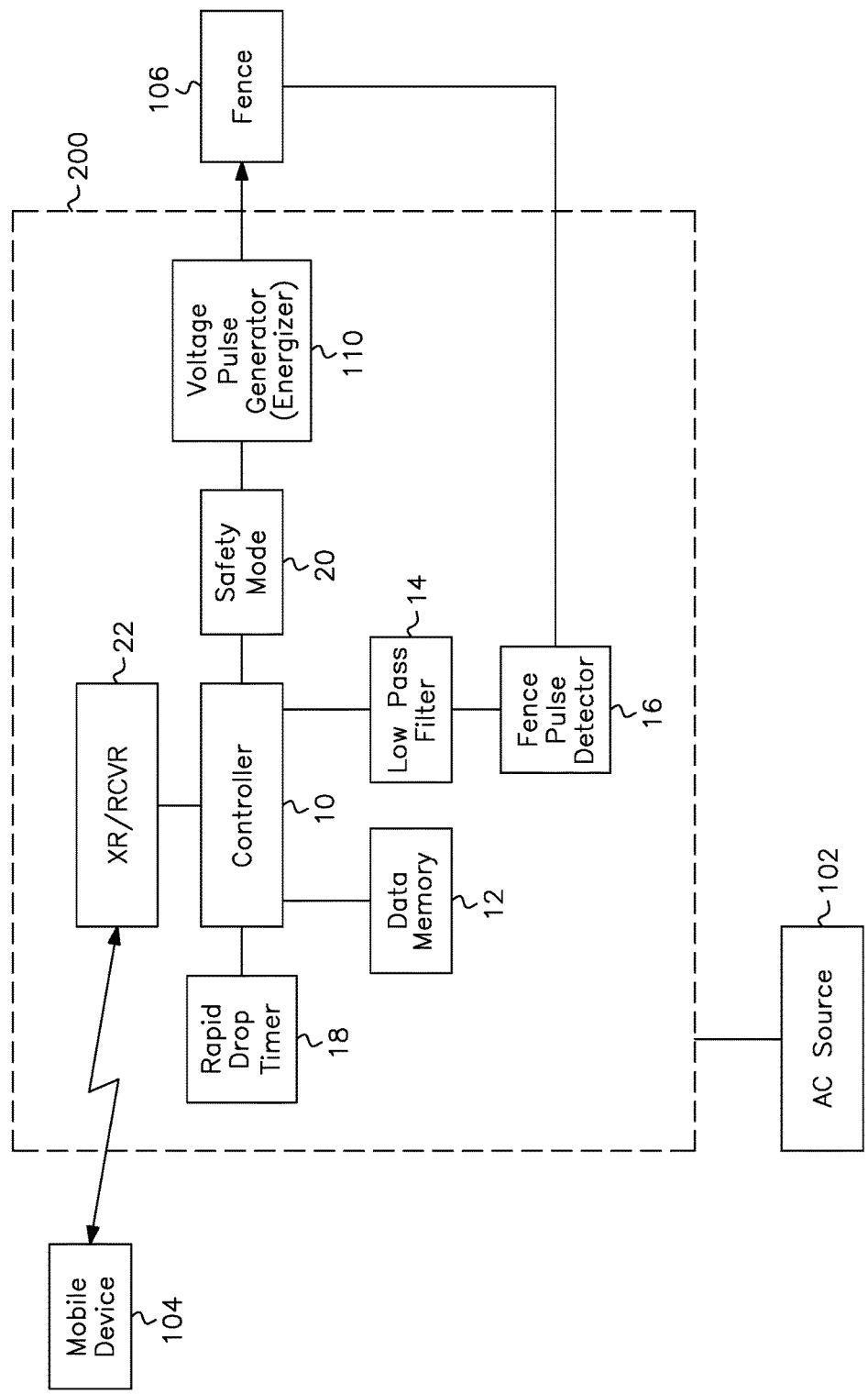
FIG. 2 is a block diagram of a remote monitoring unit with a rapid voltage drop detection system in combination with an integrated fence energizer in accordance with the present invention.

As shown in FIG. 2, the remote monitoring unit with the rapid voltage drop detection system of the instant invention may be integrated with an energizer or voltage pulse generator 110 as a combined energizer/remote monitoring unit 200. The user has only to set up an electric fence and then install the energizer/remote monitoring unit to provide a complete animal containment system with remote monitoring capability and control.

In both the remote monitoring unit 100 and combined energizer/remote monitoring unit 200 configurations, the rapid voltage drop detection system includes a controller 10, a data memory 12, a low pass filter 14, a fence pulse detector 16, and a rapid drop timer 18. The remote monitoring units 100, 200 are configured to be operable in a safety mode 20 that can be enabled or disabled, according to user preference as will be further described hereinafter. Each remote monitoring unit 100, 200 also includes a transmitter/receiver component 22 for wireless communication with the mobile device 104. The transmitter/receiver component 22 has built in GSM based cellular technology that enables the remote monitoring unit 100, 200 to be remotely monitored and controlled.

In operation, a basic set of commands can be sent using the mobile device 104 to control the remote monitoring unit 100, 200 in such a way that the remote monitoring unit can: 1) be turned on and off remotely, 2) provide the user with an indication of the status of the unit, 3) register users, and 4) have alerts sent to the user(s) in case of faults or changes in fence loading. When a command is received, the remote monitoring unit 100, 200 generates and returns a response to the user to acknowledge the command as well as changes in unit operation that may have resulted due to the command. According to the preferred embodiment, the system uses text messaging (SMS) to control the remote monitoring unit. Alternatively, it is contemplated that a smartphone application could also be used.

Voltage pulses on the fence 106 are detected by the fence pulse detector 16 as data samples and are collected on an on-going basis. Upon initial start up of the voltage pulse generator 108, 110, data samples are taken over a period of time to establish a stable voltage baseline. Generally, a stable voltage baseline is obtained when the number of data samples taken is greater than a minimum threshold number needed to ensure that subsequent measurements will be credible. The data samples are filtered by the low pass filter 14 to screen out erroneous values, as may be generated as a result of noise, interference, etc., that can produce voltage spikes or other anomalies that do not contribute to an accurate measurement of fence voltage status, as would be understood by persons of skill in the art. Generally, a stable voltage baseline is obtained in a matter of about 8-40 seconds.

Data samples are stored in the data memory 12 and, once the stable voltage baseline has been obtained, are preferably kept as a rolling average with the most recent data sample effectively "pushing out" the oldest data sample. Therefore, in the case of twenty data samples (1-20) being stored, data sample 21 will cause data sample 1 to drop off, so that the rolling average is based on data samples 2-21. Similarly, data sample 22 will cause data sample 2 to drop off, so that the rolling average is based on data samples 3-22, etc.

Once the voltage from the low pass filter has been found to be stable, a voltage measurement is typically taken every pulse or when a set interval, such as five (5) seconds, has passed or "timed-out" without a pulse being detected. The measurement representing the most recent data sample is compared with the rolling average in the data memory 12 and, if a drop in voltage is detected that exceeds a threshold percentage, the controller starts the rapid drop timer 18. The rapid drop timer 18 runs for a set time period such as between about one second and about 30 seconds. If the voltage drop remains in excess of the threshold percentage when the time period of the rapid drop timer 18 has expired, a rapid voltage drop is deemed to have occurred.

According to a preferred embodiment, a rapid voltage drop is defined as a drop in fence voltage of a specified percentage over a specified period of time. The specified percentage and period of time may be selected according to particular requirements but is generally on the order of a voltage drop of about 10% or more over a period of between about one second and about 30 seconds. Detecting rapid drops in voltage in these ranges enables the remote monitoring unit to distinguish between potentially harmful fence voltage declines and the slower types of voltage drop, occurring over more than one minute for example, that typically indicate vegetation growth interfering with the fence.

As already noted, the safety mode 20 of the remote monitoring unit 100, 200 can be enabled or disabled as desired. When the safety mode is enabled and a rapid voltage drop has been confirmed, the remote monitoring unit will automatically turn the energizer 108, 110 off and alert the user. The automatic shutdown of the energizer when the unit is operating with the safety mode enabled keeps the unit from repeatedly shocking and harming an animal that may be trapped or tangled in the fence. In addition, the user is notified immediately so that action may be taken, and preferably a reminder message is sent within a short time, for example 30 minutes, to ensure that the message is received by the user. The system may optionally be configured to send additional reminders until the user sends an acknowledgment. The user preferably also has the option, upon receipt of the message, to send a text message with an SMS command to the remote monitoring unit to turn the fence energizer 108, 110 back on.

Figure 3:
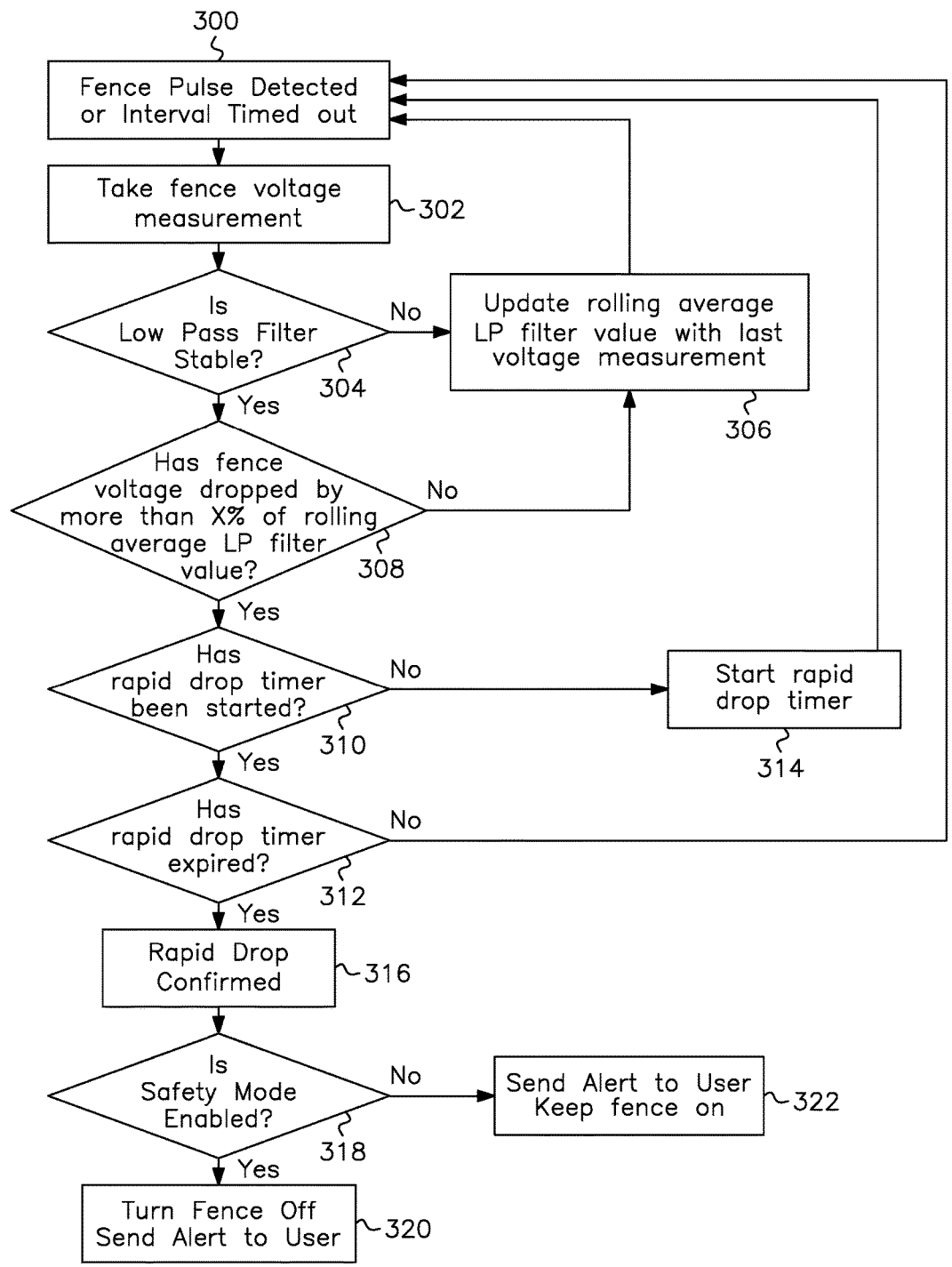
FIG. 3 is a flow chart of the operation of the rapid voltage drop detection system of the remote monitoring unit shown in FIGS. 1 and 2.

The process by which the remote monitoring unit 100, 200 detects a rapid voltage drop in accordance with the present invention, and the method employed using the remote monitoring unit 100, 200, is shown in the flowchart of FIG. 3.

To begin the monitoring process, the remote monitoring unit 100, 200 detects a fence pulse or the timing out of an interval over which a fence pulse should have been received and was not, step 300. Upon detecting the pulse or the interval having timed out, step 300, the remote monitoring unit 100, 200 takes a measurement of the fence voltage, step 302, and then determines whether the low pass filter baseline is stable, step 304. As already noted a stable low pass filter baseline is obtained when the number of data samples taken is greater than a minimum threshold number needed to ensure that subsequent measurements will be credible.

If the low pass filter baseline is not yet stable, the remote monitoring unit 100, 200 updates the rolling average kept in the data memory with the last voltage measurement, step 306, and then detects the next fence pulse or timed out interval, step 300, and repeats the steps of measuring and checking for the stability of the low pass filter baseline, steps 302 and 304.

If the low pass filter baseline is stable, step 304, the remote monitoring unit determines whether the fence voltage has dropped by more than a threshold percentage of the rolling average low pass filter value, step 308. If not, the rolling average low pass filter value is updated, step 306, and the steps of detecting and measuring are repeated as shown in FIG. 3.

If the fence voltage has dropped by more than the threshold percentage of the rolling average low pass filter value, step 308, the remote monitoring unit checks to see if the rapid drop timer has been started, step 310. If the timer has not been started, the controller starts the timer, step 314. Once the rapid drop timer has been started, the most recent data sample and all subsequent data samples are not used to update the rolling average stored in the data memory.

If the timer has been started, step 310, the unit checks to see whether the rapid drop timer has expired, step 312. If the timer has not expired, step 312, the unit continues the steps of detecting a fence pulse, taking a measurement, etc. If the timer has expired, step 312, a rapid voltage drop is confirmed, step 316. The unit determines if the safety mode is enabled, step 318, and if so the voltage pulse generator is turned off and a wireless communication is sent to the remote user notifying the user of the fence shut-down status, step 320. If the safety mode is not enabled, step 318, the unit sends a wireless communication to the user but does not turn the fence off, step 322.

The foregoing descriptions and drawings should be considered as illustrative only of the principles of the invention. The invention may be configured in a variety of shapes and sizes and is not limited by the dimensions of the preferred embodiment. Numerous applications of the present invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

What is claimed is:

1. A remote monitoring unit with a rapid voltage drop detection system for use with an electric fence comprising:
    a controller having a safety mode;
    a rapid drop timer and a data memory in communication with said controller;
    a fence pulse detector for detecting voltage pulses on the electric fence as a plurality of data samples;
    a low pass filter for receiving the plurality of data samples from the fence pulse detector and passing a plurality of filtered voltage values to the controller, said controller storing an averaged low pass filter voltage value in said data memory;
    said controller configured to compare a current incoming filtered voltage value from said low pass filter with said averaged low pass filter voltage value and, if said current incoming filtered voltage value has dropped by more than a threshold percentage of said averaged low pass filter voltage value, said controller monitoring a plurality of subsequently received filtered voltage values over a time period to confirm whether the voltage drop is a rapid voltage drop; and
    a transmitter/receiver component configured to send an alert message to a mobile device in response to said controller confirming that a rapid voltage drop has occurred.

2. The remote monitoring unit as set forth in claim 1, wherein said controller is configured to start said rapid drop timer in response to said current incoming filtered voltage value having dropped by more than the threshold percentage of said averaged low pass filter voltage value, said rapid drop timer defining the time period, said controller monitoring the plurality of subsequently received filtered voltage values until the time period of said rapid drop timer has expired.

3. The remote monitoring unit as set forth in claim 2, wherein said controller is configured, upon determining that a rapid voltage drop has occurred, to check to see if the safety mode is enabled and if the safety mode is enabled, to automatically de-energize the electric fence.

4. The remote monitoring unit as set forth in claim 3, wherein said alert message in said safety mode includes notification that the fence has been de-energized.

5. The remote monitoring unit as set forth in claim 1, further comprising a voltage pulse generator integrated with said remote monitoring unit as an energizer/monitoring unit.

6. The remote monitoring unit as set forth in claim 1, wherein said threshold percentage is greater than about 10% and said time period is between about 1 second and about 30 seconds to define the rapid voltage drop.

7. A method of monitoring voltage on an electric fence to detect a rapid voltage drop and including a safety mode, the method comprising the steps of:
    detecting a plurality of fence pulses or an absence of fence pulses over a timed-out interval;
    measuring a voltage value for each of said fence pulses;
    storing an averaged fence voltage value derived from a plurality of sequentially measured fence pulse voltage values;
    comparing a most recently measured fence pulse voltage value with said averaged fence pulse voltage value;
    if said most recently measured fence pulse voltage value has dropped by more than a threshold percentage of said averaged fence pulse voltage value, monitoring a plurality of subsequently received fence pulse voltage value measurements for a time period;
    when said time period has elapsed confirming, in response to said plurality of subsequently received fence pulse voltage value measurements continuing to show the drop to be more than the threshold percentage, that a rapid voltage drop has occurred;
    determining if said safety mode is enabled;
    if said safety mode is not enabled, sending an alert message to a mobile device reporting said rapid voltage drop; and
    if said safety mode is enabled, automatically de-energizing the fence and sending an alert message to a mobile device reporting said rapid voltage drop and said fence de-energized status.

8. The method as set forth in claim 7, wherein said time period is defined by a rapid drop timer that is started in response to determining that the most recently measured fence pulse voltage value has dropped by more than a threshold percentage of said averaged fence pulse voltage value.

9. The method as set forth in claim 7, wherein said time period is between about 1 second and about 30 seconds.

10. The method as set forth in claim 9, wherein said threshold percentage is greater than about 10%.

11. The method as set forth in claim 7, wherein said time period is between about 1 second and about 30 seconds and said threshold is at least about 10%.

12. The method as set forth in claim 7, wherein said threshold percentage is greater than about 10% and said time period is less than about 30 seconds.

13. An electric fence system comprising:
    an electric fence for animal containment and the like;
    a voltage pulse generator for energizing the fence;

a remote monitoring unit with a rapid voltage drop detection system operatively connected to said fence; and a mobile device configured for wireless communication with said remote monitoring unit;

said remote monitoring unit including a controller having a safety mode, a fence pulse detector for detecting voltage pulses on the electric fence as a plurality of data samples, and a low pass filter for receiving the plurality of data samples from the fence pulse detector and passing a plurality of filtered voltage values to the controller;

said controller storing an averaged low pass filter voltage value and configured to compare a current incoming filtered voltage value from said low pass filter with said averaged low pass filter voltage value and, if said current incoming filtered voltage value has dropped by more than a threshold percentage of said averaged low pass filter voltage value, said controller monitoring a plurality of subsequently received filtered voltage values to confirm whether the voltage drop is a rapid voltage drop and being configured to send an alert message to said mobile device in response to said controller confirming that a rapid voltage drop has occurred;

said controller being further configured, in response to determining that the safety mode is enabled and that a rapid voltage has occurred, to automatically turn off the voltage pulse generator to de-energize the electric fence.

14. The electric fence system as set forth in claim 13, wherein said remote monitoring unit includes a rapid drop timer that defines the time period over which said controller monitors the plurality of subsequently received filtered voltage values.

15. The electric fence system as set forth in claim 13, wherein said voltage pulse generator is integrated with said remote monitoring unit as an energizer/monitoring unit.

16. The electric fence system as set forth in claim 13, wherein said threshold percentage is greater than about 10% and said time period is less than about 30 seconds to define the rapid voltage drop.

* * * * *